(12) United States Patent
Eslamy et al.

(10) Patent No.: US 7,691,670 B2
(45) Date of Patent: Apr. 6, 2010

(54) INTERCONNECTION OF LEAD FRAME TO DIE UTILIZING FLIP CHIP PROCESS

(75) Inventors: Mohammad Eslamy, Palo Alto, CA (US); Anthony C. Tsui, Saratoga, CA (US)

(73) Assignee: GEM Services, Inc., San Jose, CA (US)

( * ) Notice: Subject to any disclaimer, the term of this patent is extended or adjusted under 35 U.S.C. 154(b) by 0 days.

(21) Appl. No.: 12/172,117

(22) Filed: Jul. 11, 2008

(65) Prior Publication Data

US 2009/0273065 A1     Nov. 5, 2009

Related U.S. Application Data

(60) Provisional application No. 61/126,243, filed on May 1, 2008.

(51) Int. Cl.
    *H01L 21/44*     (2006.01)
(52) U.S. Cl. ................. 438/106; 438/14; 438/15; 438/107; 438/108; 438/111; 438/123; 438/127; 257/E21.508
(58) Field of Classification Search ........... 438/111
See application file for complete search history.

(56) References Cited

U.S. PATENT DOCUMENTS 5,817,540 A * 10/1998   Wark ................ 438/107

2006/0063311 A1 * 3/2006   Ho et al. ................ 438/127

* cited by examiner

*Primary Examiner*—N Drew Richards
*Assistant Examiner*—Kyoung Lee
(74) *Attorney, Agent, or Firm*—Townsend and Townsend and Crew LLP

(57) ABSTRACT

Embodiments in accordance with the present invention relate to techniques which avoid the problems of deformation in the shape of a solder connection in a flip chip package, resulting from solder reflow. In one embodiment, a solder-repellent surface is created adjacent to the solder to constrain the reflow and thereby maintain the vertical profile of the solder. Examples of such a solder-repellent surface include an oxide (such as Brown Oxide) of the lead frame, or a tape (such as Kapton) which is used as a dam bar to control/constrain the solder flow on the leads prior to the encapsulation step. In another embodiment, the solder connection may be formed from at least two components. The first component may reflow at high temperatures to provide the necessary adhesion between solder ball and the die, with the second component reflowing at a lower temperature to provide the necessary adhesion between the solder ball and the leads. An example of such multi-component connections include a first high temperature reflow solder ball paired with a second low temperature reflow solder. Another example includes a solder ball with a hard core (such as Cu, stainless steel, or a plastic material stable at high temperatures) coated with a lower temperature reflow material.

19 Claims, 5 Drawing Sheets

INTERCONNECTION OF LEAD FRAME TO DIE UTILIZING FLIP CHIP PROCESS

CROSS-REFERENCE TO RELATED APPLICATION

The instant nonprovisional patent application claims priority to U.S. Provisional Patent Application No. 61/126,243, filed May 1, 2008 and incorporated by reference herein for all purposes.

BACKGROUND OF THE INVENTION

FIG. 1 shows a simplified perspective view of a conventional flip chip package 100. FIG. 1A shows a cross-sectional view of the package of FIG. 1 taken along line 1A-1A'.

This conventional flip chip package 100 comprises die 102 enclosed within plastic package body 104. Electrical contacts 106 on the top surface of die 102 are in electrical communication with the leads 108 projecting from the package body, through electrically conducting solder connections 110.

As indicated in FIG. 1A, it is required that the leads 108 maintain a minimum height Z over the die. However, as shown FIG. 1B, during the step of attaching the leads to the die, heating of the solder connection may result in solder reflow, causing the shape of the solder connection to deform and possibly resulting in the height of the lead Z' being less than the required height Z.

Accordingly, there is a need in the art for improved techniques for fabricating a flip chip die which avoids the problems resulting from deformation in a solder contact resulting from reflow.

BRIEF SUMMARY OF THE INVENTION

Embodiments in accordance with the present invention relate to techniques which avoid the problems of deformation in the shape of a solder connection in a flip chip package, resulting from solder reflow. In one embodiment, a solder-repellent surface is created adjacent to the solder to constrain the reflow and thereby maintain the vertical profile of the solder. Examples of such a solder-repellent surface include an oxide (such as Brown Oxide) of the lead frame, or a tape (such as Kapton) which is used as a dam bar to control/constrain the solder flow on the leads prior to the encapsulation step. In another embodiment, the solder connection may be formed from at least two components. The first component may reflow at high temperatures to provide the necessary adhesion between solder ball and the die, with the second component reflowing at a lower temperature to provide the necessary adhesion between the solder ball and the leads. An example of such multi-component connections include a first high temperature reflow solder ball paired with a second low temperature reflow solder. Another example includes a solder ball with a hard core (such as Cu, stainless steel, or a plastic material that is stable at high temperatures) that is coated with a lower temperature reflow material.

These and other embodiments of the present invention, as well as its features and some potential advantages are described in more detail in conjunction with the text below and attached figures.

DETAILED DESCRIPTION OF THE INVENTION

Embodiments in accordance with the present invention relate to techniques, employed alone or in combination, which avoid the problems of deformation in the shape of a solder connection in a flip chip package, resulting from solder reflow.

In certain embodiments, a solder-repellent surface is formed on the surface of the lead adjacent to the surface expected to be in contact with the solder connection. This solder-repellent surface constrains reflow of the solder and thereby maintains the requisite vertical spacing between the lead and the die.

Figure 1:
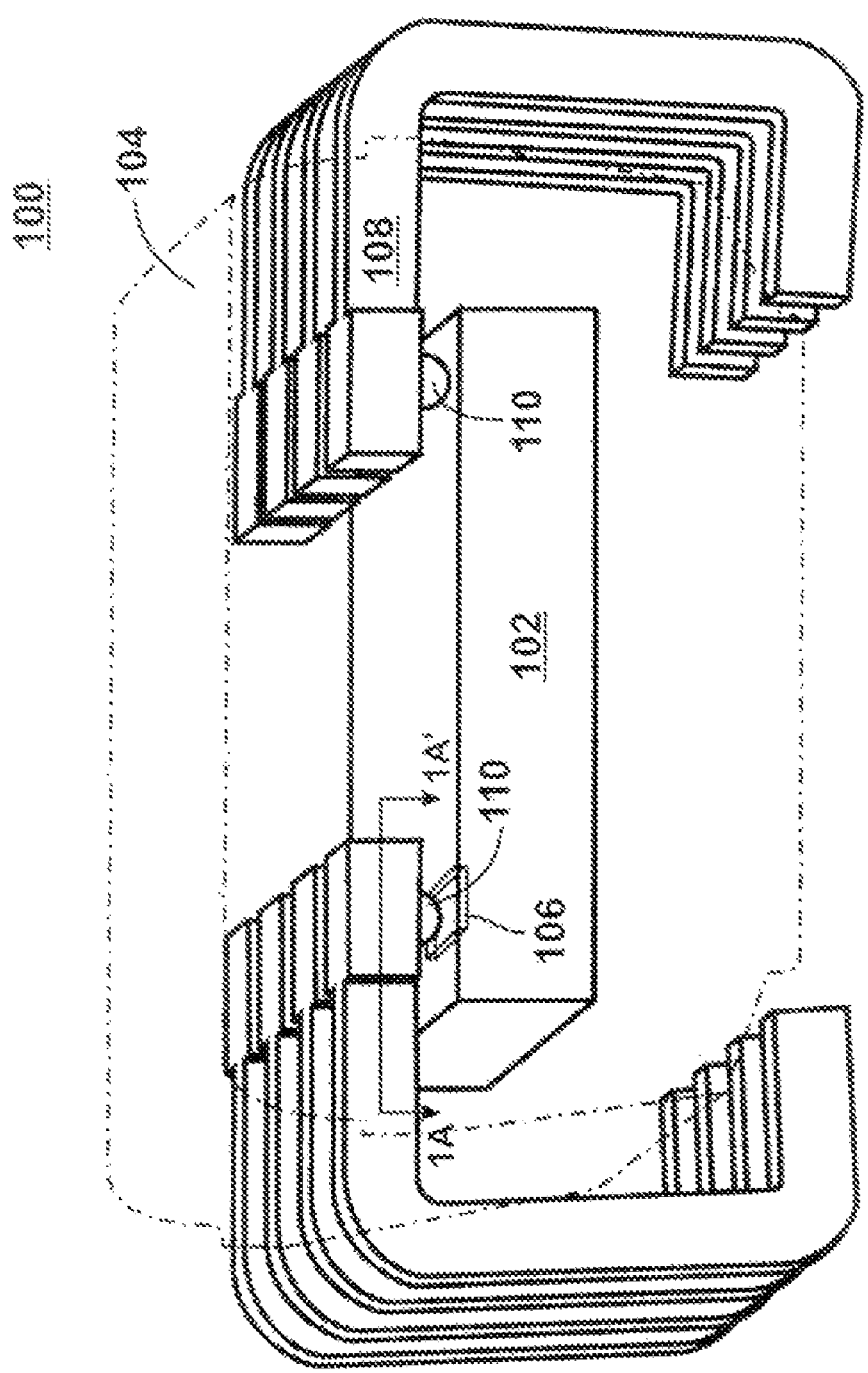
FIG. 1 shows a simplified perspective view of a conventional flip chip package.
Figure 1A:
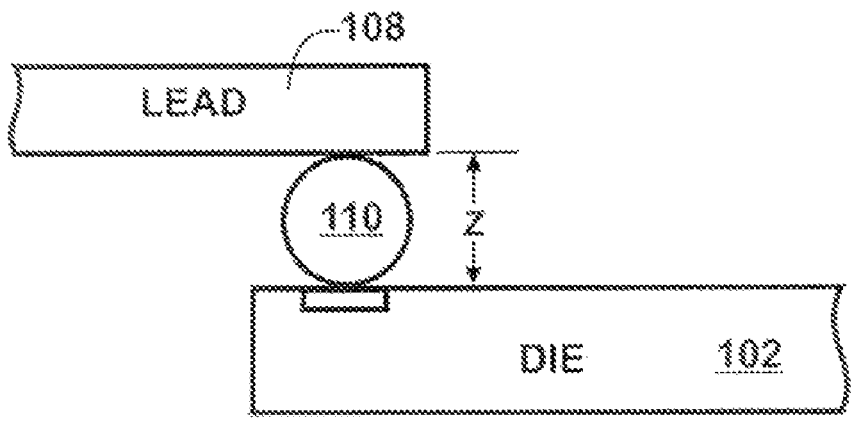
FIGS. 1A-B shows simplified perspective views a conventional flip chip package.
Figure 1B:
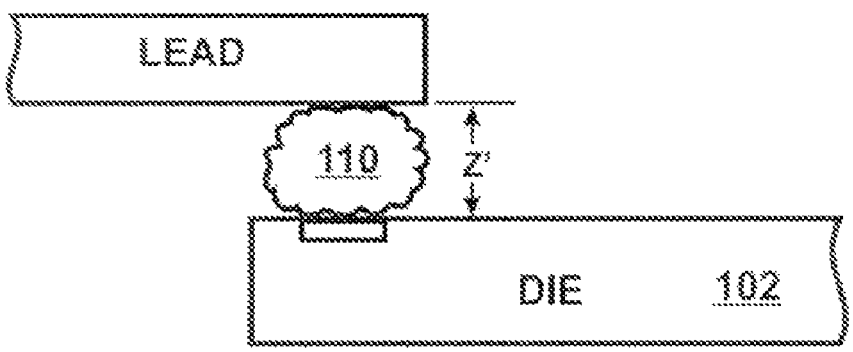
Figure 2:
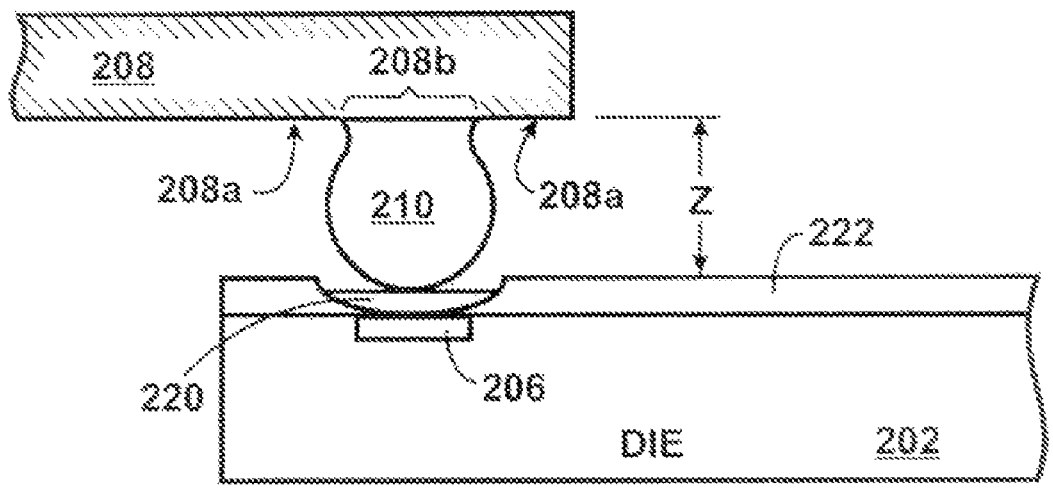
FIG. 2 shows a simplified shows a simplified cross-sectional view of one embodiment of the present invention, which utilizes a non-wettable oxide surface on a lead finger, to constrain solder reflow.

FIG. 2 shows a simplified cross-sectional view of one embodiment of the present invention. In FIG. 2, lead 208 is provided having portion 208a of its surface oxidized (for example Brown Oxide), and other portions 208b substantially free of oxide. Such oxidation of only portions of the lead may be accomplished by masking selected portions, followed by exposure of unmasked portions to an oxidizing ambient.

Solder ball 210 is provided attached to pad 206 present on the top surface of the die. As particularly shown in FIG. 2, the solder ball is supported on an electroless nickel immersion gold (ENIG) material 220, that is present within an opening of passivation 222 covering the top surface of the die. Alternatively or in conjunction with ENIG, the solder ball may be supported on a wettable surface provided by sputtering.

In the step of attaching the lead 208 to the die via the solder contact, the solder ball is heated to above its reflow temperature. As shown in FIG. 2, however, the presence of the oxidized lead portions 208a adjacent to the oxide-free lead portion 208a in contact with the solder, serve to restrain the flow of heated solder. In particular, the non-wettable character of the oxide inhibits the spread of the molten solder. Thus, while the portions of the solder distal from the lead may bulge, the solder proximate to the lead is constrained from flowing, and thereby allows the solder to substantially maintain its vertical profile.

On the other side of the solder contact, the combination of the ENIG material 220 within the opening in the passivation, similarly serves to constrain the flow of molten solder, thereby preserving the vertical profile.

It is noted that obtaining a completely oxide-free surface to receive the solder may be difficult to achieve, given the prevalence of oxygen in the environment. Accordingly, prior to bringing the lead into contact with the molten solder, the solder may be dipped into a flux material that serves to remove any native oxide.

While the particular embodiment just described utilizes a bare Cu surface to receive the solder, this is not required by the present invention. In accordance with alternative embodiments, the surface that is configured to receive the solder may comprise a plated metal such as silver, or a stack of plated stack of metal such as Ni/Au or Ni/Pd/Au. In such embodiments, the wettability of the plated metal/metal stack may allow only a native oxide layer (rather than an intentionally grown Brown Oxide layer) to contain the flow of solder in the desired manner.

And while the particular embodiment just described utilizes a solder-repellent, non-wettable surface in the form of an oxide, this is not required by the present invention. In accordance with alternative embodiments, other materials could be employed to limit the spread of solder and resulting deformation in the shape of the solder contact. For example in alternative embodiments portions of the lead could be coated with a non-wettable polymer material configured to withstand temperatures in excess of the solder reflow temperature.

Figure 3A:
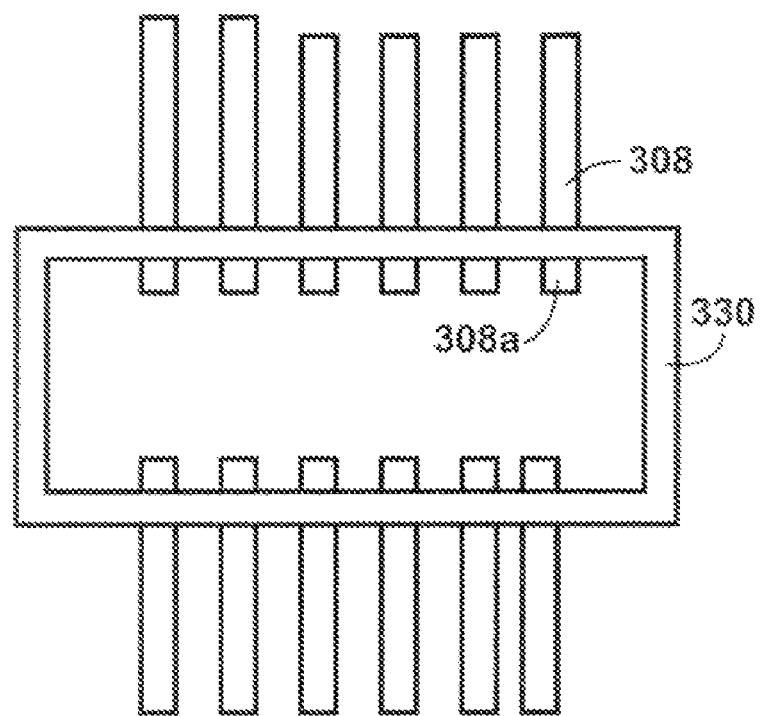
FIG. 3A shows a plan view of an embodiment of the present invention, which utilizes an adhesive, non-wettable tape material that is stable at high temperatures, on a lead finger, to constrain solder reflow.

In yet another embodiment, the flow of molten solder could be constrained by the presence of a tape. For example, during fabrication of a flip chip package, it may be necessary to maintain the orientation and spacing of a number of leads to allow those leads to match with the corresponding locations of contacts on the top of the die. In order to ensure this lead orientation and spacing is maintained, the leads may be secured to an adhesive tape such as Kapton. This is shown in the underside view of FIG. 3A, wherein the bottoms of a plurality of leads 308 are maintained in place by tape 330.

Figure 3B:
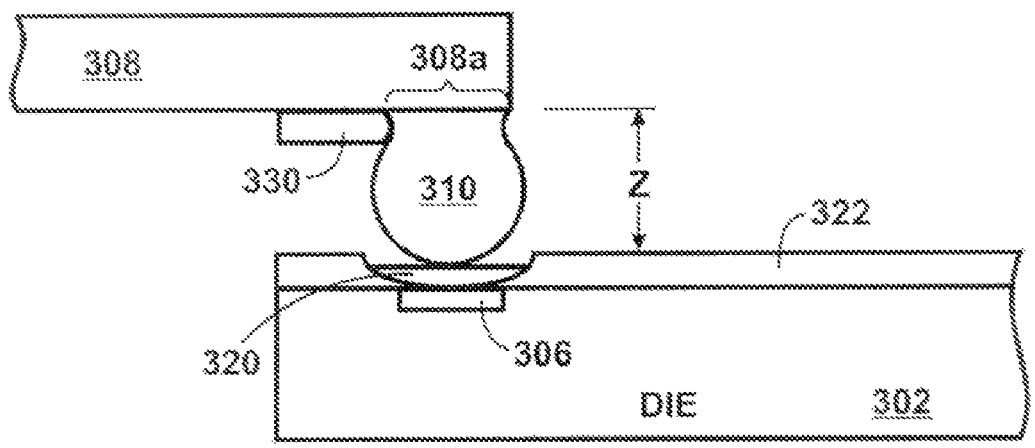
FIG. 3B shows a simplified shows a simplified cross-sectional view of the embodiment of the present invention shown in FIG. 3A.

In accordance with an embodiment of the present invention, this tape 330 may be utilized to constrain the reflow of solder. FIG. 3B shows a simplified cross-sectional view, wherein tape 330 is present proximate to the edge of lead 308, leaving an end portion 308a of the lead 308 uncovered.

Solder ball 310 is provided attached to pad 306 present on the top surface of the die. As particularly shown in FIG. 3, the solder ball is supported on ENIG material 320 present within an opening of passivation 322 covering the top surface of the die. Alternatively or in conjunction with ENIG, the solder ball may be supported on a wettable surface provided by sputtering.

In the step of attaching the lead 308 to the die via the solder contact, the solder ball is heated to above its reflow temperature. As shown in FIG. 3B, however, the presence of tape 330 adjacent to lead portion 308a in contact with the solder, restrains the flow of heated solder. In particular, the non-wettable character of the tape inhibits the spread of the molten solder. In addition, surfaces of the lead such as the vertical edge of the lead, may also bear a non-wettable oxide that further inhibits the flowing of the molten solder.

Thus as shown in FIG. 3B, while the portions of the solder distal from the lead may bulge, the solder proximate to the lead is constrained from flowing, and thereby allows the solder to substantially maintain its vertical profile.

Figure 3C:
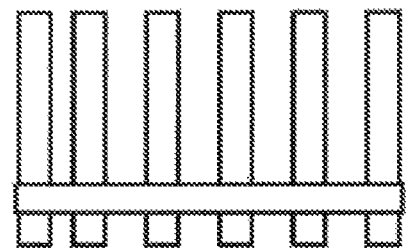
FIG. 3C shows a plan view of an alternative embodiment of the present invention utilizing tape material to constrain solder reflow.
Figure 3C:
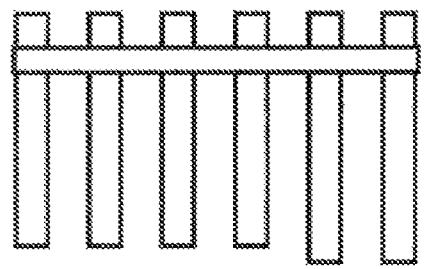

While the above embodiment illustrates an arrangement of a tape in continuous rectangle configuration, this is not required by the present invention. In accordance with alternative embodiments, strips of tape could be used as shown in FIG. 3C. Further alternatively, tape in the form of adjacent pairs of strips or pairs of rectangles could be utilized to constrain the reflow of solder between them.

In accordance with certain embodiments, the thickness of the tape may act a physical impediment to the flow of solder. Moreover, in accordance with certain embodiments, use of tape of a predetermined thickness may serve to maintain the desired spacing between the lead and the die. In such an embodiment, the tape serves not only as a non-wettable surface, but its bulk physically supports the lead over the die.

Moreover, while the above embodiment is described in conjunction with the use of a Kapton tape, this is also not required by the present invention. A variety of tape materials exhibiting stability at high temperatures and the desired adhesive and non-wettable property, could be employed to constrain molten solder flow. Any organic material that can withstand the high reflow temperature, with pressure sensitive adhesive on one side of the film to adhere/attach to the leads, can be used.

While the above embodiment illustrates an arrangement of a tape in rectangle, this is not required by the present invention. In accordance with alternative embodiments, strips of tape could be used as shown in FIG. 3C.

In accordance with alternative embodiments, a vertical profile of a solder connection may be maintained despite reflow, utilizing a solder connection comprising at least two components. Specifically, a first component of the solder may reflow at a higher temperatures to provide the necessary adhesion to the die, while remaining as a solid at a lower reflow temperature to provide the desired vertical spacing. The second component of the solder may reflow at the second, lower temperature, to provide adhesion between the first solder component and the lead finger.

Figure 4:
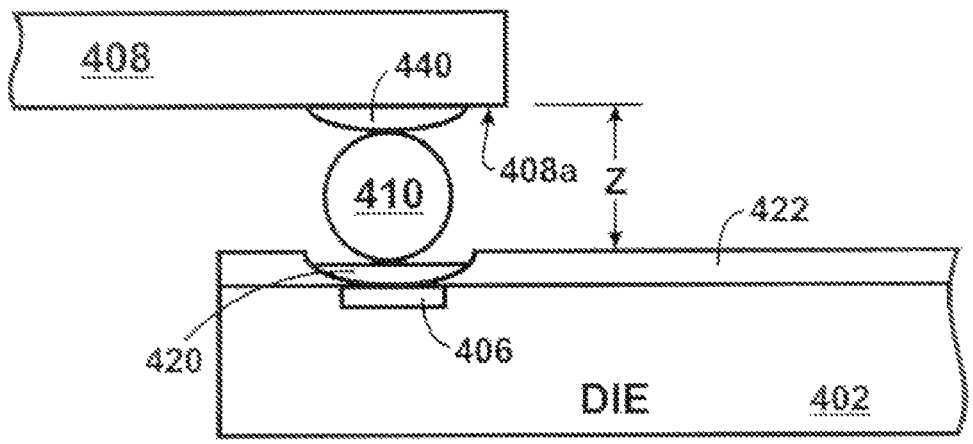
FIG. 4 shows a simplified shows a simplified cross-sectional view of one embodiment of the present invention, which utilizes a solder contact comprising a second material having a reflow temperature lower than a first material.

FIG. 4 shows a simplified cross-sectional view of one example of such an embodiment in accordance with the present invention. In particular, solder ball 410 is provided attached to pad 406 present on the top surface of the die 402. As particularly shown in FIG. 4, the solder ball is supported on ENIG material 420, that is present within an opening of passivation 422 covering the top surface of the die. Alternatively or in conjunction with ENIG, the solder ball may be supported on a wettable surface provided by sputtering.

FIG. 4 shows that lead 408 is provided with an electrically conducting adhesive material 440 exhibiting a lower reflow temperature than the material of the solder ball 410. Upon heating, material 440 reflows, allowing adhesive attachment with the solder ball 410. The material comprising solder ball 410, however, remains solid at this temperature, and its bulk ensures that the desired height Z between the lead and the die, is maintained.

The following TABLE provides a listing of electrically conducting adhesive materials which can be used according to embodiments of the present invention together with their respective reflow temperatures:

TABLE

| MATERIAL | COMPOSITION (%) | REFLOW TEMPERATURE (° C.) |
|---|---|---|
| Solder SAC 101 | Sn 98.9, Ag 1.0, Cu 0.1 | 217 |
| Solder SAC 105 | Sn 98.5, Ag 1.0, Cu 0.5 | 217 |
| Solder SAC 405 | Sn 95.5, Ag 4.0, Cu 0.5 | 217 |
| | Sn 96.5/Ag 3.5 | 221 |
| lead-based solder | Sn 10/Pb 90, | 275 |
| | Sn 62/Pb 36/Ag 2, | 179 |
| | Sn 63/Pb 37 | 183 |

During operation of the die, a certain amount of heat would be expected to be generated. Accordingly, a requirement of the solder materials used in a package according to an embodiment of the present invention, is that they remain solid at such expected operating temperatures.

The solder contact serves not only to allow for electrical communication between the die and the lead finger, but also desirably serves as a conduit for thermal energy generated by the die, to be transported outside the package through the lead finger for dissipation in the environment. Accordingly, the various materials comprising the solder contact should exhibit a thermal conductivity necessary to allow the requisite flow of heat from the die.

Another example of an approach in accordance with an embodiment of the present invention involves the use of a solder contact comprising a solder ball having a hard core made from a first material having a relatively high reflow temperature, and having a coating made from a material having a lower reflow temperature.

Figure 5:
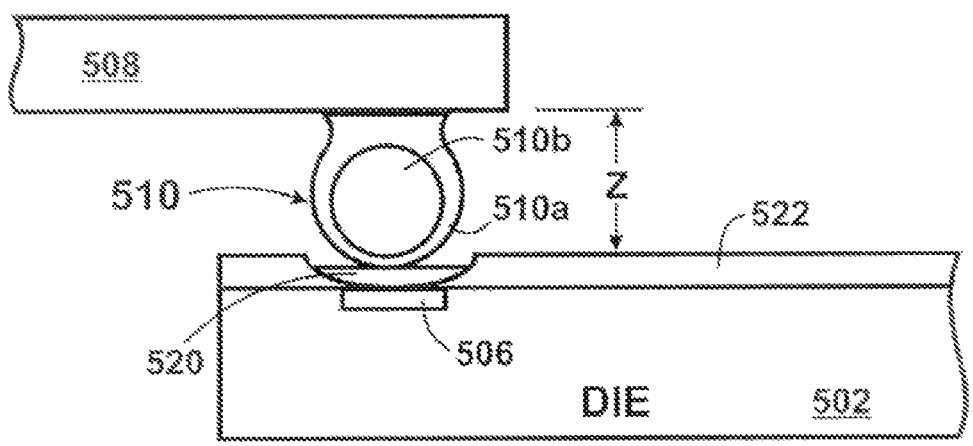
FIG. 5 shows a simplified shows a simplified cross-sectional view of one embodiment of the present invention, which utilizes a solder contact comprising a hard core material having a reflow temperature that is higher than that of an outside coating.

FIG. 5 illustrates a simplified cross-sectional view of such an embodiment. In particular, solder contact 510 comprising an outer material 510a (coating) and an inner material (hard core) 510b, is provided attached to pad 506 present on the top surface of the die 502. The solder contact is provided with the die 502, supported on ENIG material 520, that is present within an opening of passivation 522 covering the top surface of the die. Alternatively or in conjunction with ENIG, the solder ball may be supported on a wettable surface provided by sputtering.

FIG. 5 shows that upon heating of the solder contact to a reflow temperature of the outer coating material 510a, this material reflows, allowing adhesion to the lead finger 508. The core material 510b comprising the core of the solder contact, remains solid at this temperature. In an example, the core of the solder contact may comprise a solder ball, and the coating may comprise an electrically conducting material that reflows at a temperature lower than the melting point of the solder ball. The presence of this solid core maintains the spacing Z between the lead and the die. Examples of electrically and thermally conducting materials exhibiting relatively high reflow temperatures which could be used as the core material for a solder contact, include but are not limited to copper, stainless steel, and plastic materials exhibiting a sufficiently high reflow temperature.

While not specifically mentioned above, in certain embodiments more than one of the techniques specifically described may be employed in combination. For example, in accordance with particular embodiments the vertical profile offered by a solder contact may be substantially maintained above a reflow temperature utilizing both a solder-repellent surface (such as oxide or tape), and a solder contact structure having a first component exhibiting lower reflow temperature.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating a package for a semiconductor device, the method comprising:
   providing a die having a pad and a solder ball in contact with the pad;
   providing lead frame comprising a lead finger having a solder repellent surface adjacent to a portion of the lead finger that is expected to be in contact with the solder ball; and
   heating the solder ball to above a reflow temperature, such that the solder ball adheres to the lead finger portion, while the solder repellent surface constrains reflow of the solder to maintain a vertical profile of the solder ball and ensure a minimum spacing between the lead finger and the die.

2. The method of claim 1 further comprising forming the solder repellent surface by oxidizing the lead frame.

3. The method of claim 2 wherein the oxidizing comprises intentionally forming Brown Oxide.

4. The method of claim 3 wherein the portion of the lead finger comprises bare Cu, a plated metal, or a plated metal stack.

5. The method of claim 2 wherein the oxidizing comprises allowing a native oxide to form.

6. The method of claim 5 wherein the portion of the lead finger comprises a plated metal or a plated metal stack.

7. The method of claim 6 wherein the plated metal or plated metal stack comprises Ag, Ni/Au, or Ni/Pd/Au.

8. The method of claim 2 further comprising:
   patterning a mask on the portion of the lead finger prior to oxidation of the lead frame; and
   removing the mask.

9. The method of claim 1 further comprising forming the solder repellent surface by placing a tape on the lead finger.

10. The method of claim 9 wherein the tape is comprised of Kapton.

11. The method of claim 9 wherein the tape is applied to stabilize a plurality of lead fingers prior to an encapsulation process.

12. The method of claim 9 wherein a thickness of the tape maintains the lead finger at the minimum spacing between the lead finger and the die.

13. The method of claim 1 wherein the die is provided with the solder ball in contact with the pad through an opening in a passivation layer and an electroless nickel immersion gold (ENIG) layer that serve to constrain a flow of solder on a surface of the die.

14. The method of claim 1 wherein the die is provided with the solder ball in contact with the pad through a sputtered wettable layer that serves to constrain a flow of solder on a surface of the die.

15. A method of fabricating a package for a semiconductor device, the method comprising:
   providing a die having a pad and a solder contact in contact with the pad, the solder contact comprising,
   a first component in contact with the pad, the first component having a first reflow temperature, and
   a second component having a second reflow temperature lower than the first reflow temperature;
   providing a lead frame comprising a lead finger; and
   heating the solder contact to above the second reflow temperature and below the first reflow temperature, such that the first component ensures a minimum spacing between the lead finger and the die, and the second component ensures adhesion between the solder contact and the lead finger.

16. A method of fabricating a package for a semiconductor device, the method comprising:
   providing a die having a pad and a solder contact in contact with the pad, the solder contact comprising,
   a first component in contact with the pad, the first component having a first reflow temperature, and a second component having a second reflow temperature lower than the first reflow temperature;

providing a lead frame comprising a lead finger; and heating the solder contact to above the second reflow temperature and below the first reflow temperature, such that the first component ensures a minimum spacing between the lead finger and the die, and the second component ensures adhesion between the solder contact and the lead finger, the method further comprising providing a solder repellent surface adjacent to a portion of the lead finger that is in contact with the second component of the solder contact.

17. A method of fabricating a package for a semiconductor device, the method comprising:

providing a die having a pad and a solder contact in contact with the pad, the solder contact comprising, a hard core component having a first reflow temperature, and a coating component having a second reflow temperature lower than the first reflow temperature;

providing a lead frame comprising a lead finger; and heating the solder contact to above the second reflow temperature and below the first reflow temperature, such that reflow of the coating component ensures adhesion between the solder contact and the die and the lead finger, and the hard core component ensures a minimum spacing between the lead finger and the die, the method further comprising providing a solder repellent surface adjacent to a portion of the lead finger that is in contact with the second component of the solder contact.

18. The method of claim 17 wherein the hard core component is selected from plastic or metal.

19. The method of claim 18 wherein the hard core component is selected from copper or stainless steel.

* * * * *